United States Patent
Uenishi

[11] Patent Number: 6,069,372
[45] Date of Patent: May 30, 2000

[54] INSULATED GATE TYPE SEMICONDUCTOR DEVICE WITH POTENTIAL DETECTION GATE FOR OVERVOLTAGE PROTECTION

[75] Inventor: Akio Uenishi, Tokyo, Japan

[73] Assignee: Mitsubishi Denki Kabushiki Kaisha, Tokyo, Japan

[21] Appl. No.: 09/116,342

[22] Filed: Jul. 16, 1998

[30] Foreign Application Priority Data

Jan. 22, 1998 [JP] Japan .................................. 10-010563

[51] Int. Cl.⁷ .................................................. H01L 29/74
[52] U.S. Cl. ........................................... 257/139; 257/355
[58] Field of Search .................................. 257/139, 140, 257/355–356, 360

[56] References Cited

U.S. PATENT DOCUMENTS

| | | | |
|---|---|---|---|
| 4,783,690 | 11/1988 | Walden et al. | 257/140 |
| 5,162,966 | 11/1992 | Fujihira | 257/140 |
| 5,360,984 | 11/1994 | Kirihata | 257/140 |
| 5,714,775 | 2/1998 | Inoue et al. | 257/139 |
| 5,798,538 | 8/1998 | Nadd et al. | 257/139 |

OTHER PUBLICATIONS

Tomoyuki Yamazaki, et al., "Avalanche Secured IGBT," 1992 National Convention Record I.E.E. Japan, vol. 5, pp. 5–16.

Primary Examiner—David Hardy
Attorney, Agent, or Firm—Oblon, Spivak, McClelland, Maier & Neustadt, P.C.

[57] ABSTRACT

Internal gate electrodes (71) are all connected in common to a gate terminal, and a floating gate electrode (72) is connected to the gate electrode of an NMOS transistor (M1). An external emitter electrode (91) is provided on a first major surface of P-type diffused lease region (21), and N-type diffused emitter region (31) and P-type diffused base region (21) are short-circuited. The source of the NMOS transistor (M1) and an emitter terminal are also connected to the external emitter electrode (91). The drain of the NMOS transistor (M1) is connected to an external terminal.

20 Claims, 5 Drawing Sheets

INSULATED GATE TYPE SEMICONDUCTOR DEVICE WITH POTENTIAL DETECTION GATE FOR OVERVOLTAGE PROTECTION

BACKGROUND OF THE INVENTION

1. Field of the Invention

The present invention relates to the techniques for improving the overvoltage protection function in the insulated gate type power devices which are represented by insulated gate bipolar transistors (hereinafter referred to as "IGBT").

2. Description of the Background Art

For power devices such as power transistors represented by IGBTs, it is desirable to improve their breakdown voltage and current-carrying capacities so that they can be used in high voltages and high currents. Particularly, elements should be designed with a sufficient margin for breakdown voltage. This is because when power devices are used actually in a circuit, an overvoltage might be applied by such as the fluctuations of power supply voltage, the regeneration of load power, and the induced electromotive force (spike voltage) which occur in wire because of a prompt current change in switching and inductance of the wire. As a result, a breakdown may occur at P-type base junction (in the case of N-channel type IGBTs) of the cell of IGBT, and a breakdown current flows so that the thyristor being parasitic on the IGBT latches up, leading to the breakdown of the IGBT.

Adding a sufficient margin for breakdown voltage, however, raises manufacturing cost and power loss. Hence, there has been discussed to find a reasonable level.

As one answer to this problem, there is a method (called "active clamp") in which when a high voltage approaching a breakdown voltage is applied between the main electrodes (between the collector and emitter) of a power transistor, a voltage to be applied to the control electrode (i.e., gate) of the power transistor is controlled to drive the power transistor to enter ON state (hereinafter referred to as "ON drive"). With this method, the impedance between the main electrodes is lowered, which suppresses an increase in the voltage applied thereto, preventing a breakdown current from flowing to the P-type base junction.

In utilizing "active clamp," there are required means for detecting that the voltage between the main electrodes has approached a breakdown voltage, and means for driving a power transistor to enter ON drive with a control electrode. The detection of voltage between the main electrodes has been conventionally made by connecting an avalanche diode having a high breakdown voltage which is provided apart from (i.e., outside of) a power transistor, between the collector and gate of the power transistor. The breakdown voltage of the avalanche diode is set to be slightly lower than that of a power transistor to be protected. Therefore, in the event of breakdown of the avalanche diode, the gate of the power transistor is charged with the charge carried in its breakdown current, thereby increasing the gate voltage. This allows a power transistor to enter ON state immediately before the power transistor leads to its breakdown. In order to prevent the forward current that flows to the avalanche diode at the normal on-state drive, a diode is connected in series with the avalanche diode in the opposite direction.

With the technique of providing an avalanche diode apart from a power transistor as described, however, it is necessary to adjust the breakdown voltage of the avalanche diode and that of the power transistor in separate manufacturing steps so that they have a proper relation. Accordingly, this technique is not suitable for production in quantity and also increases cost and the number of parts.

Therefore, incorporating an avalanche diode in a power transistor has been proposed. Both share several diffusion steps and lithography steps, thus being suitable for mass production.

FIG. 8 is a cross-sectional view that schematically shows the configuration of N-channel IGBT 200 of the planar gate type in which an avalanche diode is incorporated. On a first major surface of N-type base region 1 (the major surface located above in FIG. 8) having a low impurity concentration, P-type diffused base regions 2 are selectively formed at specific intervals. N-type diffused emitter regions 3 having a high impurity concentration, which have been selectively formed in the first major surface, are provided in the P-type diffused base region 2. In the P-type diffused base region 2, the region which is sandwiched between the N-type base region 1 and the N-type diffused emitter region 3, and also is exposed to the first major surface (hereinafter the region is referred to as "channel region") is covered with, for example, a gate oxide film 6 formed by a silicon oxide film. Internal gate electrodes 7 which are formed by, for example, polysilicon having a high impurity concentration is opposed to the channel region through the gate oxide film 6. All the internal gate electrodes 7 are connected in common to a gate terminal.

The P-type diffused lease region 2 except for the channel region and the N-type diffused emitter region 3, are connected to an emitter terminal (Emitter), through an external emitter electrode 9 in the first major surface.

On a second major surface of the N-type base region 1 (i.e., the major surface located under in FIG. 8), N-type buffer region 4 having a high impurity concentration, P-type region 5 having a higher impurity concentration than the N-type buffer region 4, and an external collector electrode 10, are stacked in this order. A collector terminal (Collector) is connected to the external collector electrode 10.

Aside from the P-type diffused base region 2, at least one P-type avalanche diode diffused region 8 is formed, which is connected through an electrode 93 to the anode of a diode D0 provided outside, on the first major surface of N type base region 1. The cathode of the diode D0 is connected to a gate terminal. That is, to an avalanche diode Da formed by the N-type base region 1 and the avalanche diode diffused region 8, the diode D0 is connected in series in the opposite direction to prevent the forward current flow, as described earlier.

Here, the avalanche diode diffused region 8 can have a greater curvature in shape than that of the P-type diffused base region 2 by making the former shallower than the latter. Therefore, the electric field of the backward bias in the avalanche diode Da can be greater than that in the boundary between the N-type base region 1 and the P-type diffused base region 2.

The following description will be given of the cases where a biasing is made in N-channel IGBT 200 so that the potential of a gate terminal is lower than that of an emitter terminal, by using a gate driving power supply (not shown) and an appropriate current limiting resistor (not shown). In this case, the potential of a channel region is lower than that of P-type diffused base region 2 except for the channel region, causing no depletion in the channel region. Accordingly, even when the potential of a collector terminal is higher than that of the emitter terminal, hardly or no current flows between the two, to enter OFF state. In this state, if the voltage of the collector terminal is increased, a depletion layer expands into the N-type base region 1 to strengthen the electric field in the boundary between the N-type base region 1 and the N-type diffused base region 2.

When this electric field is higher than the critical electric field of silicon (approximately $2\times10^5$ V/cm), the ionization by collision of carriers becomes violent rapidly so that IGBT exhibits breakdown characteristics. In the N-channel IGBT 200 with an avalanche diode Da, however, at a potential difference lower than that in the breakdown of the N-channel IGBT 200, the avalanche diode Da receives the critical electric field to cause a breakdown. Then, by the breakdown of the avalanche diode Da, the current flows to the gate driving power supply through the diode D0 and the current limiting resistor. As a result, the voltage generated in the current limiting resistor raises the potential of the gate terminal, thereby the potential of the channel region increases, and an inversion layer (channel) is generated there. Since the current flows between the emitter terminal and collector terminal through the channel, the impedance between the main electrodes is lowered to relax the overvoltage applied therebetween, so that the electric field in the boundary between the N-type base region 1 and the P-type diffused base region 2 is also relaxed to avoid a breakdown at this boundary.

It is assumed that the above operation is basically the same for the cases where the N-channel IGBT 200 is in a transient operation state, and it is also possible to suppress the spike voltage in the turn-off operation. The configuration of N-channel IGBT 200 is presented, for example, by Tomoyuki Yamazaki et al., *AVALANCHE SECURED IGBT* (1992 *National Convention Record I.E.E. Japan* vol. 5, pp 5–16).

In the above technique, however, the following problems remain. A first problem is that an avalanche diode Da cannot be formed in P-type diffused base region 2 whereat a channel region will be formed. Therefore, it is necessary to form an avalanche diode Da apart from the array of P-type diffused base regions 2 that are repetitively formed at specific pitches. As a result, the vicinity of the avalanche diode Da differs in electric field distribution from the vicinity of the array of the P-type diffused base regions 2. Particularly, the breakdown occurred in the state where carriers exist in a high density in N-type base region 1 could not be detected by the avalanche diode Da (that is, the avalanche diode Da causes no breakdown before a breakdown occurs between the N-type base region 1 and the P-type diffused base region 2 in such a state).

A second problem relates to the outflow of excess carriers stored in N-type base region 1. Such excess carriers flow out during turn-off operation, through not only P-type diffused base region 2 but an avalanche diode Da. This may raise the potential of a gate terminal to retard the turn-off operation.

A third problem relates to the possibility that if OFF state is obtained with the potential of a gate terminal lower than that of an emitter terminal a diode D0 may enter the conductive state, and then the reverse bias is applied to an avalanche diode Da, so that the breakdown voltage of the avalanche diode Da may be virtually lowered.

SUMMARY OF THE INVENTION

According to a first aspect of the present invention, an insulated gate type semiconductor device comprises: a semiconductor substrate; first and second current electrodes sandwiching the semiconductor substrate; a potential detection gate in a floating state for detecting a monitor potential that depends on a potential difference between the first and second current electrodes, and a drive gate insulated from the first and second current electrodes, for driving the first and second current electrodes to enter a conductive state when the monitor potential exceeds a specific level.

According to a second aspect of the present invention, the insulated gate type semiconductor device of the first aspect is characterized in that the drive gate and the potential detection gate are provided in first and second grooves, respectively, each extending in a thickness direction of the semiconductor substrate.

According to a third aspect of the present invention, the insulated gate type semiconductor device of the first aspect is characterized in that the drive gate and the potential detection gate are opposed, through insulating films, to a major surface of a side of the semiconductor substrate on which the first current electrode is provided.

According to a fourth aspect of the present invention, the insulated gate type semiconductor device of the first aspect further comprises: an insulated gate type transistor having a control electrode to which the potential detection gate is connected, and first and second current electrodes insulated from the control electrode; and a drive circuit for performing charging/discharging to the drive gate, based on a current that flows to the second current electrode of the insulated gate type transistor. In this device, the first current electrode of the insulated gate type transistor is connected to the first current electrode of the insulated gate type semiconductor device, and the insulated gate type transistor enters a conductive state when the monitor potential exceeds the specific level.

According to a fifth aspect of the present invention, the insulated gate type semiconductor device of the fourth aspect is characterized in that the drive circuit amplifies and output a current that flows to the second current electrode of the insulated gate type transistor, thereby charging the drive gate.

According to a sixth aspect of the present invention, the insulated gate type semiconductor device of the fourth aspect is characterized in that the drive circuit includes: a bipolar transistor having an emitter, a collector connected to the drive gate, and a base connected to the second current electrode of the insulated gate type transistor; a first resistance connected between the emitter and base of the bipolar transistor; and a second resistance connected between the base of the bipolar transistor and the drive gate of the insulated gate type semiconductor device.

In the insulated gate type semiconductor device according to the first aspect of the present invention, the potential is monitored in the so-called insulated gate, and a temporary ON drive is allowed when excess voltage is applied in the non-conductive state between the first and second current electrodes. Therefore, the protection from the excess voltage is possible for the breakdown occurred in the state where carriers exist locally in a semiconductor layer present between the first and second current electrodes. In addition, no avalanche diode is incorporated, and therefore, the voltage of a drive gate does not increase by the outflow of excess carriers, resulting in no influence on the turn-off operation. Also, the breakdown voltage does not drop in the event of the operation with the reverse bias applied between the drive gate and the first current electrode.

In the insulated gate type semiconductor device according to the second or third aspect of the present invention, since a drive gate and a potential detection gate are similar to each other in structure, it is required only a slight change in the manufacturing steps of conventional insulated gate type semiconductor devices. Further, a potential detection gate can be formed in the region whereat a drive gate will be formed, as in conventional insulated gate type semiconductor devices. Therefore, the monitor potential satisfactorily reflects the electric field and voltage between first and second current electrodes. This secures an accurate detection when excess voltage is applied in the non-conductive state between the first and second current electrodes.

In the insulated gate type semiconductor device according to the fourth aspect of the present invention, if a monitor potential exceeds a specific level while retaining a potential detection gate in the floating state, the current flows to the second current electrode of the insulated gate type transistor, and a drive circuit can drive the insulated gate type semiconductor device to enter a temporary ON drive.

In the insulated gate type semiconductor device according to the fifth aspect of the present invention, the current that flows to the current electrodes of the insulated gate type transistor is amplified to charge the drive gate. Therefore, even if the size of the insulated gate type transistor is reduced, the effect of the fourth aspect can be obtained. When excess voltage is applied in the non-conductive state between the first and second current electrodes of the insulated gate type semiconductor device, an accurate detection is attained by decreasing the input capacity of the insulated gate type transistor to reduce the influence on the electrostatic capacity of the potential detection gate.

In the insulated gate type semiconductor device according to the sixth aspect of the present invention, if no overvoltage state occurs in the turn-off operation, the insulated gate type transistor is in the non-conductive state, and the drive gate of the insulated gate type semiconductor device is discharged with a great current due to the amplification action of the bipolar transistor, so that the insulated gate type semiconductor device is turned off promptly. On the other hand, for the overvoltage state in the course of the turn-off operation, the insulating gate type transistor enters the conductive state, and therefore, the current that flows to the base of the bipolar transistor is bypassed, to enter OFF state. As a result, the drive gate of the insulated gate type semiconductor device is discharged through the first and second resistances, to retard the turn-off operation. Thus, the induced voltage may not increase by the presence of parasitic inductance, preventing the overvoltage state from worsening.

Accordingly, it is an object of the present invention to realize "active clamp" while avoiding the first to third problems of prior art as stated, and to provide semiconductor devices capable of executing stable and high speed operations.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
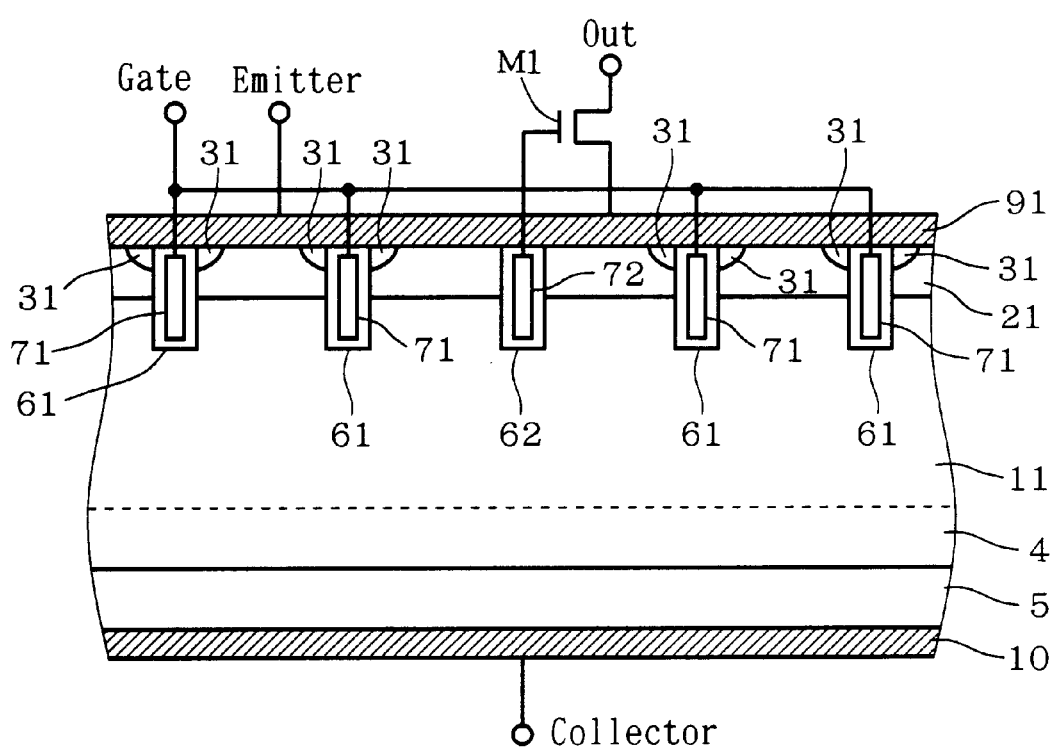
FIG. 1 is a cross-sectional view that schematically shows the configuration of a first preferred embodiment of the present invention.

FIG. 1 is a cross-sectional view that schematically shows the configuration of a semiconductor device 101 having the function of overvoltage protection and the connection between the device 101 and an NMOS transistor M1, according to a first preferred embodiment of the present invention. P-type diffused base region 21 is formed on a first major surface of N-type base region 11 (i.e., the major surface located above in FIG. 1) having a low impurity concentration. N-type diffused emitter regions 31 are selectively provided at specific pitches on a first major surface of the P-type diffused base region 21 (i.e., the major surface apart from the first major surface of the N-type base region 11) except one skipped over.

From the first major surface of the P-type diffused base region 21 to the midway of the N-type base region 11, a groove is excavated so as to penetrate the N-type diffused emitter region 31 and the P-type diffused base region 21. An internal gate electrode 71 covered with a gate insulating film 61 is embedded in this groove. The internal gate electrode 71 is formed ay, for example, polysilicon having a high impurity concentration. In the vicinity of the groove in which the gate electrode 71 is formed, a groove is excavated so as to penetrate the P-type diffused base region 21, from the first major surface of the P-type diffused base region 21 to the midway of the N-type base region 11. A floating gate electrode 72 covered with a gate insulating film 62 is embedded in this groove. The gate electrode 72 is formed by, for example, polysilicon having a high impurity concentration.

All the internal gate electrodes 71 are connected in common to a gate terminal (Gate), and the floating gate electrode 72 is connected to the gate electrode of the NMOS transistor M1. An external emitter electrode 91 is provided on the first major surface of the P-type diffused base region 21, so that the N-type diffused emitter region 31 and the P-type diffused base region 21 are short-circuited. To the external emitter electrode 91, the source of the NMOS transistor M1 and an emitter terminal (Emitter) are also connected. The drain of the NMOS transistor M1 is connected to an external terminal (Out).

On a second major surface of the N-type base region 11 (the major surface located below in FIG. 1), N-type buffer region 4 having a high impurity concentration (e.g., $1 \times 10^{16}$ to $1 \times 10^{18}$ cm$^{-3}$), P-type region 5 having an impurity concentration higher than that of the N-type buffer region 4 (e.g., $1 \times 10^{18}$ to $1 \times 10^{20}$ cm$^{-3}$), and an external collector electrode 10, are stacked in this order. A collector terminal (Collector) is connected to the external collector electrode 10.

With this configuration, it is possible to form the internal gate electrode 71 and the floating gate electrode 72 in the same manufacturing step. The difference between the two electrodes is that the N-type emitter region 31 is present or not on the upper side of the groove containing either electrode. Therefore, two types of grooves can be easily obtained by skipping over one of a plurality of N-type diffused emitter regions 31 to be formed at specific pitches.

As can be seen from the above configuration, the semiconductor device 101 is one of the trench gate type IGBT, characterized in that part of internal gate electrodes 71 is employed as a floating gate electrode 72, and the formation of N-type diffused emitter region 31 is omitted as to the groove that envelops the floating gate electrode 72.

The following description will be given of the cases where in the semiconductor device 101 a biasing is made so that the potential of a gate terminal is lower than that of an emitter terminal, by using a gate driving power supply (not shown) and an appropriate current limiting resistor (not shown). In this case, the potential of the channel region, which corresponds to the portions adjacent to the groove enveloping the internal gate electrode 71 in the P-type diffused base region 21, is lower than that of the P-type diffused base region 21 except for the channel region, to cause no depletion of the channel region. Accordingly, even when the potential of a collector terminal is raised than that of the emitter terminal, hardly or no current flows between the two, to enter OFF state.

In this state, if the potential of the collector terminal is increased, a depletion layer expands into the N-type base region 11 to strengthen the electric field in the boundary between the N-type base region 11 and the N-type diffused base region 21 (hereinafter referred to as "junction boundary"). As the potential of the collector increases, a depletion layer extends longer, and the effective charge therein increases the electric field of the junction boundary (hereinafter referred to as "junction boundary electric field"). When the junction boundary electric field reaches the critical electric field of silicon, impact ionization becomes vigorous to cause the breakdown of the trench type IGBT section in the semiconductor device 101.

At this time, the potential of the floating gate electrode 72 increases in proportion to the junction boundary electric field. This will be described by referring to FIGS. 2 to 4. A floating gate electrode 72 can be formed in the vicinity of an internal gate electrode 71, having nearly the same shape with each other. Particularly, in the power devices with breakdown voltages of about several hundred to several thousand volt, the electric field and potential of the trench type IGBT have small changes in the plane that is vertical to the thickness direction of elements. Consequently, one dimensional distributions of electric field and potential with respect to the thickness direction of elements will be discussed hereafter.

Figure 2:
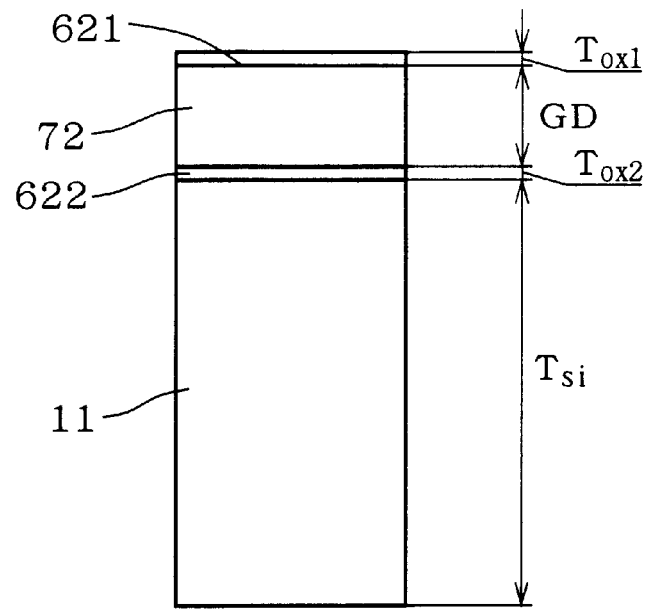
FIG. 2 is a schematic diagram for explaining the first preferred embodiment.

FIG. 2 is a schematic diagram if considered only the thickness direction in the position at which a floating gate electrode 72 is present. A gate insulating film 62 enveloping the floating gate electrode 72 appears here as a gate insulating film 621 which exists in an external emitter electrode 91 side of the floating gate electrode 72, and as a gate insulating film 622 which exists in an external collector electrode 10 side of the floating gate electrode 72. Setting the thicknesses of the gate insulating films 621 and 622 be $T_{ox1}$ and $T_{ox2}$, respectively, and the thickness of the floating gate electrode 72 be GD. N-type base region 11 having the thickness of $T_{si}$ is present on the external collector electrode 10 side of the gate insulating film 622.

Figure 3:
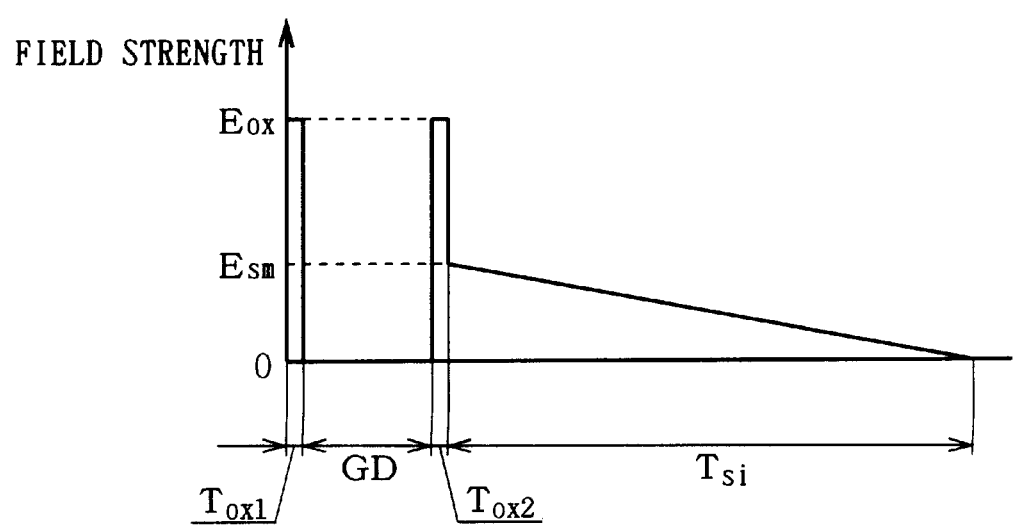
FIG. 3 is a graph for explaining the first preferred embodiment.

FIG. 3 is a graph showing the field strength of the structure shown in FIG. 2. The distance from a first major surface of N-type base region 1 is used to enter the horizontal axis of the graph in FIG. 3. Since a floating gate electrode 72 can bee treated as a conductor, its field strength is 0. The effective charge density of the N-type base region 11 is nearly constant, and therefore, its field strength can be approximated to decrease linearly. Since the gate insulating films 621, 622 are an insulating material, their field strengths take the fixed value of $E_{ox}$. Setting the dielectric constant of silicon and that of silicon oxide film be $\epsilon_{si}$ and $\epsilon_{ox}$, respectively, the field strength of the N-type base region 11 at the locations in contact with the gate insulating film 622, i.e., the strength of junction boundary electric field, is found from the equation: $E_{sm}=\epsilon_{ox} \cdot E_{ox}/\epsilon_{si}$.

Figure 4:
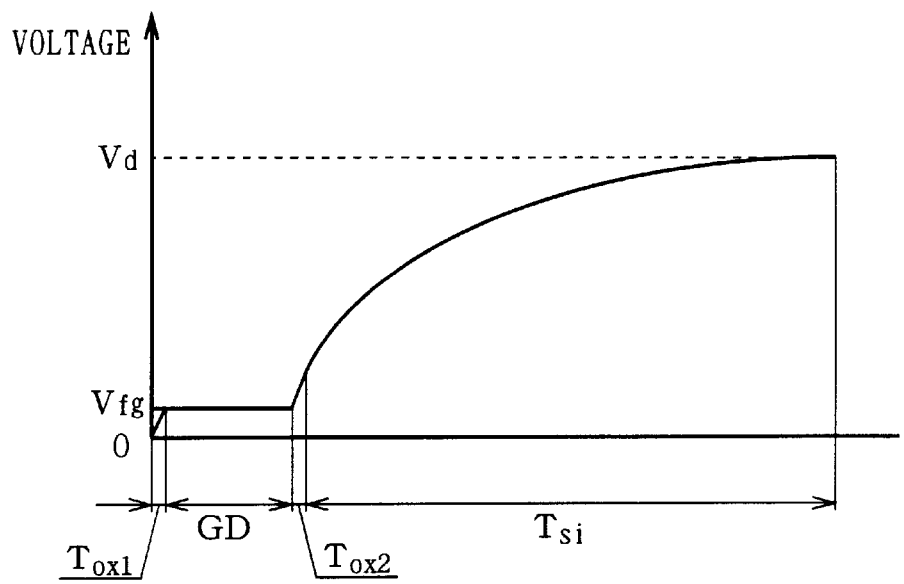
FIG. 4 is another graph for explaining the first preferred embodiment.

FIG. 4 is a graph showing the voltages in the structure shown in FIG. 2. Like FIG. 3, the distance from a first major surface of N-type base region 1 is used to enter the horizontal axis of the graph in FIG. 4. When the potential in the first major surface of N-type base region 1 (i.e., the potential of an external emitter electrode 91) is used as the reference, the potential of a floating gate electrode 72 is determined by the equation: $Vfg=E_{ox} \cdot T_{ox1}$. The voltages applied to N-type buffer region 4 and P-type region 5 are small and neglected. The voltage applied between an emitter terminal and a collector terminal is found from the following equation:

$$Vd=E_{sm} \cdot T_{si}/2+E_{ox} \cdot (T_{ox1}+T_{ox2})=Vfg\{(1/2) \cdot (\epsilon_{ox}/\epsilon_{si}) \cdot (T_{si}/T_{ox1})+(1+\alpha)\}$$

wherein $\alpha=T_{ox2}/T_{ox1}$.

As described above, the strength of junction boundary electric field that relates directly to breakdown conditions, and the voltage applied between the emitter terminal and collector terminal, can be monitored with the potential of the floating gate electrode 72.

The fact that the potential of the floating gate electrode 72 is proportional to the junction boundary electric field is also confirmed by device simulation. Also, the fact that the breakdown voltage of IGBT section hardly differs depending on the presence or absence of the floating gate electrode 72, can be confirmed by device simulation.

The potential of the floating gate electrode 72 depends on the electrostatic capacity, and its potential is detected by the terminal to which no stationary current flows, such as the gate electrode of an insulated gate electrode. In this case, the gate of the NMOS transistor M1 is connected to the floating gate electrode 72. To protect the IGBT section from overvoltage, the gate threshold voltage of the NMOS transistor M1 is so adjusted that it enters the conductive state at a voltage lower than the voltage at which the IGBT section causes a breakdown (i.e., the junction boundary electric field reaches the critical electric field).

Connecting, between an external terminal and a gate terminal, a drive circuit which supplies charge to the gate terminal based on the current that flows to the drain of the NMOS transistor M1, can increase the voltage of the gate terminal to allow a semiconductor device 101 to enter a temporary ON drive. Here, an insulated gate element (the NMOS transistor M1 in this case), which has a gate to be connected to the floating gate electrode 72, preferably has a smaller input capacity. This input capacity is connected as a load of the floating gate electrode 72, and thus required to reduce the influence on the electrostatic capacity. It is therefore necessary to reduce the size of the insulated gate element. This reduces the current that flows between a transistor insulated gate element and an external emitter electrode 91. However, this current may be amplified by, for example, a drive circuit. Its concrete structure will be described in the following second and fourth preferred embodiment.

Thus, in this preferred embodiment, the state immediately before a power transistor leads to its breakdown can be detected only lay the capacitive coupling of the floating gate electrode 72 provided in the cell whereat IGBT section will be formed. Specifically, thanks to the direct monitor of the electric field of the cell, it is possible to protect the power transistor from the breakdown in the state where carriers exist locally in a high density in the N-type base region 11. Additionally, since no avalanche diode is incorporated, the gate voltage is not increased because of the outflow of excess carriers, resulting in no influence on the turn-off operation. In the event of operation in the state where the potential of the gate terminal of IGBT section is lower than that of an emitter terminal (i.e., the reverse bias state), it is free from the disadvantage that the breakdown voltage is lowered. It is therefore possible to solve the first through third problems of prior art and to avoid the breakdown and destruction of a power transistor.

Furthermore, since an internal gate electrode 71 and a floating gate electrode 72 can be obtained in a similar structure, only a slight change is required for the manufacturing steps of conventional IGBTS. In addition, since a floating gate electrode 72 can be formed in a conventional cell, the potential detected by the floating gate electrode 72 satisfactorily reflects the electric field and voltage between the main electrodes. This secures an accurate detection when an overvoltage state is applied.

As a floating gate electrode 72, an internal gate electrode 71 can be employed. That is, only an internal gate electrode 71 serving as a floating gate electrode 72, is connected to the gate of the NMOS transistor M1, and other internal gate electrodes 71 are connected to a gate terminal in the same manner as in general IGBTS. In this case, N-type diffused emitter region 31 is present in the vicinity of the upper side of the internal gate electrode 71 serving as the floating gate electrode 72. However, the effect of the present invention cannot be damaged in view of the descriptions related to FIGS. 2 to 4, by modifying an external emitter electrode 91 so that it is not be connected to the N-type diffused emitter region 31, alternatively, by interposing an insulator between the N-type diffused emitter region 31 and the external emitter electrode 91. Still further, N-type diffused emitter regions 31 can be formed as specific intervals without need for a skipping. This permits use of more conventional manufacturing steps.

Second Preferred Embodiment

Figure 5:
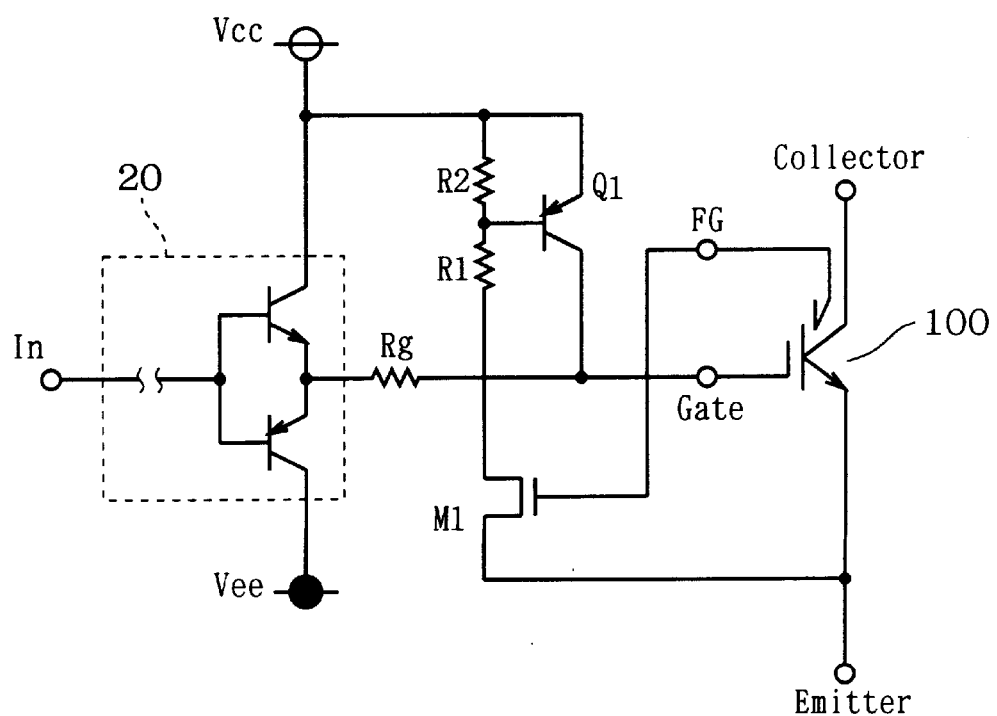
FIG. 5 is a circuit diagram showing a second preferred embodiment of the present invention.

FIG. 5 is a circuit diagram showing a second preferred embodiment of the present invention. This embodiment demonstrates a technique of driving a power transistor 100. As a power transistor 100, the semiconductor device 101 shown in the first preferred embodiment can be employed. In FIG. 5, the figure of the power transistor 100 is drawn for convenience, and the V-shaped diagram is drawn for designating a floating gate FG, in addition to the figure of a conventional IGBT. The floating gate electrode 72 of the semiconductor device 101 is electrically connected to the floating gate FG.

The gate and source of the NMOS transistor M1 are connected to the floating gate FG and the emitter terminal of the power transistor 100, respectively. The drain of the transistor M1 is connected to the potential point Vcc that gives the potential Vcc (hereinafter, the same letters is used for a potential point and the potential given by the potential point) through the serially-connected resistors R1 and R2. The emitter of PNP transistor Q1 and the resistor R2 are connected in common to the potential point Vcc, the collector of the transistor Q1 is connected to the gate terminal of the power transistor 100, and the base of the transistor Q1 is connected to the drain of the NMOS transistor M1 through the resistor R1.

A gate driver 20 has the output terminal that is connected to the gate terminal of the power transistor 100 through a gate driving resistor Rg, and is driven when two potential points Vcc, Vee are connected. The potential Vee is lower than the potential Vcc. The gate driver 20 has, for example, the complementary type output stage, and causes the current to flow tc the output end of the gate driver 20, based on the signal fed to its input terminal In.

The circuit shown in FIG. 5 operates as follows. When a power transistor 100 is not in an overvoltage state, the potential of a floating gate FG is low. Therefore, the NMOS transistor M1 is in OFF state and its drain current does not flow, so that PNP transistor Q1 is also in OFF state. As a result, the power transistor 100 receives the control of ON or OFF state, according to the output of a gate driver 20, which is given to the gate terminal of the power transistor 100 through a gate driving resistor Rg.

With increasing the voltage applied between the collector terminal and emitter terminal of the power transistor 100, the potential of the floating gate FG increases. As described in the first preferred embodiment, when the gate threshold value of the NMOS transistor M1 is set properly, the NMOS transistor Q1 enters ON state prior to reaching the breakdown voltage. Then, a base current flows to the PNP transistor Q1 through the resistor R1, so that the PNP transistor M1 enters ON state. When the power transistor 100 is in OFF state or in the course of turn-off operation, the output of the gate driver 20 is set to be lower than the potential of the emitter terminal of the power transistor 100. The current, however, flows into the gate driver 20 from the potential point Vcc through the PNP transistor Q1 and the gate driving resistor Rg, so that a voltage generates in the gate driving resistor Rg, to increase the potential of the gate terminal of the power transistor 100. As a result, the power transistor 100 is turned on and then operates to prevent an increase in the potential of the collector terminal. That is, the constant-voltage clamp operation due to analog feedback is performed. It is therefore possible to prevent the breakdown of the power transistor 100 because of all overvoltage applied.

If it is able to sink the current supplied from the PNP transistor Q1 through the gate driving resistance Rg, the complementary type output stage may be omitted from the structure of the gate driver 20.

Third Preferred Embodiment

Figure 6:
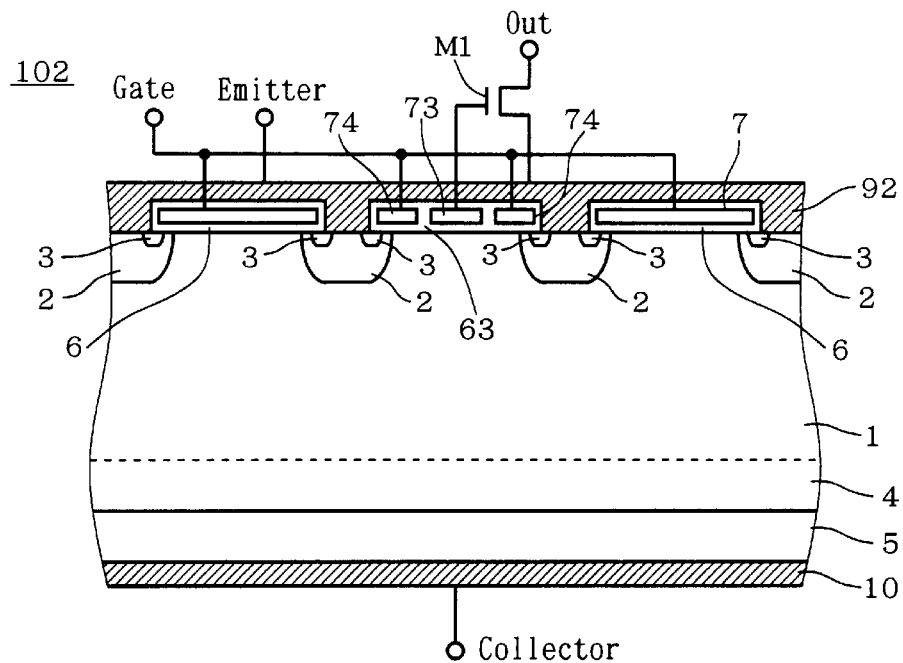
FIG. 6 is a cross-sectional view that schematically shows the configuration of a third preferred embodiment of the present invention.

FIG. 6 is a cross-sectional view that schematically shows the configuration of a semiconductor device 102 having the function of overvoltage protection, and the connection between the device 102 and the NMOS transistor M1. P-type diffused base regions 2 are selectively formed at specific pitches on a first major surface (the major surface located above in FIG. 6) of N-type base region 1 having a low impurity concentration. N-type diffused emitter regions 3 having a high impurity concentration, which have been selectively formed on the first major surface, are provided in the P-type diffused base region 2.

In the P-type diffused base region 2, the channel region which is sandwiched between the N-type base region 1 and the N-type diffused emitter region 3, and is also exposed to the first major surface, is covered with, for example, a gate oxide film 6 formed by a silicon oxide film. Internal gate electrodes 7, which are formed by, for example, polysilicon having a high impurity concentration, are opposed to the channel region through the gate oxide film 6. All the internal gate electrodes 7 are connected in common to a gate terminal (Gate). The N-type diffused emitter region 3 and the P-type diffused base region 2 except for the channel region, are all connected to an emitter terminal (Emitter) through an external emitter electrode 92 on the first major surface.

On a second major surface of the N-type base region 1 (i.e., the major surface located below in FIG. 6), N-type buffer region 4, P-type region 5, and an external collector electrode 10, are stacked in this order in the same manner as in the first preferred embodiment. A collector terminal (Collector) is connected to the external collector electrode 10.

The above stated configuration shows the so-called planar type IGBT, although the configuration is also provided in the conventional N-channel IGBT 200, the characteristic feature of the semiconductor device 102 is to add a floating gate electrode 73. The floating gate electrode 73 is opposed, through the gate oxide film 63, to the first major surface whereat no P-type diffused lease region 2 is formed in the N-type base region 1. The floating gate electrode 73 is connected to the gate electrode of the NMOS transistor M1.

The source of the NMOS transistor M1 and an emitter terminal are also connected to an emitter electrode 92. The drain of the NMOS transistor M1 is connected to an external terminal (Out).

As shown in FIG. 6, an internal gate electrode 7 has also portions opposed to the first major surface whereat no P-type diffused base region 2 is formed. Unlike the internal gate electrode 7, the floating gate electrode 73 does not have the region opposed to the P-type diffused base region 2 which is sandwiched between the N-type diffused emitter region 3 and the N-type base region 1 on the first major surface. On the other hand, as shown in FIG. 6, an internal gate electrode 74 opposed to the gate oxide film 63 may be provided in the P-type diffused base region 2 which is sandwiched between the N-type diffused emitter region 3 and the N-type base region 1, so that the internal gate electrode 74 is connected to the internal gate electrode 7.

Since the floating gate electrode 73 and the internal gate electrodes 7, 74 have the structures as described, they can be easily formed in the same manufacturing step. Like the first preferred embodiment, only a slight change is required for the manufacturing steps of conventional IGBTS. Also, since the floating gate electrode 73 can be formed in a conventional cell, the potentials detected by the floating gate electrode 73 satisfactorily reflect the electric field and voltage between the main electrodes. This secures an accurate detection when an overvoltage state is applied.

As a floating gate electrode 73, an internal gate electrode 7 can be employed. That is, only an internal gate electrode 7 serving as a floating gate electrode 73, is connected to the gate of the NMOS transistor M1, and other internal gate electrodes 7 are connected to a gate terminal in the same manner as in general IGBTs. In this case, N-type diffused emitter region underlies the internal gate electrode 7 serving as a floating gate electrode 73. However, the effect of the present invention cannot be damaged in view of the descriptions related to FIGS. 2 to 4, by modifying an external emitter electrode 92 so that it is not be connected to the N-type diffused emitter region 3, alternatively, by interposing an insulator between the N-type diffused emitter region 3 and the external emitter electrode 92. Still further, there is no need to divide the internal gate electrode 74 and the floating gate electrode 73 shown in FIG. 6. This permits use of more conventional manufacturing steps.

Compared to the aspect described in the first preferred embodiment, the third preferred embodiment requires no process of forming grooves which involves complicated etching and film forming steps, enabling to suppress cost. However, it should be noted that the technique shown in the first preferred embodiment is related to the trench gate type, and therefore, the performance of the tradeoff between on-state (or saturation) voltage and switching loss is excellent.

It is, off course, possible to employ the semiconductor device 102 of the third preferred embodiment as the power transistor 100 of the second preferred embodiment. In this case, the floating gate electrode 73 is electrically connected to the floating gate FG.

Fourth Preferred Embodiment

Figure 7:
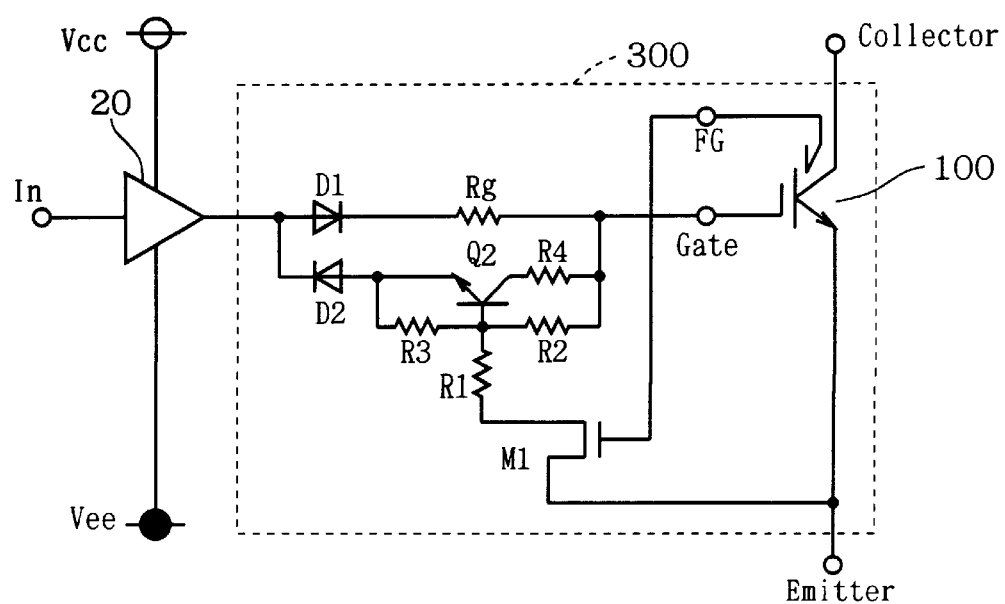
FIG. 7 is a circuit diagram showing a fourth preferred embodiment of the present invention.
Figure 8:
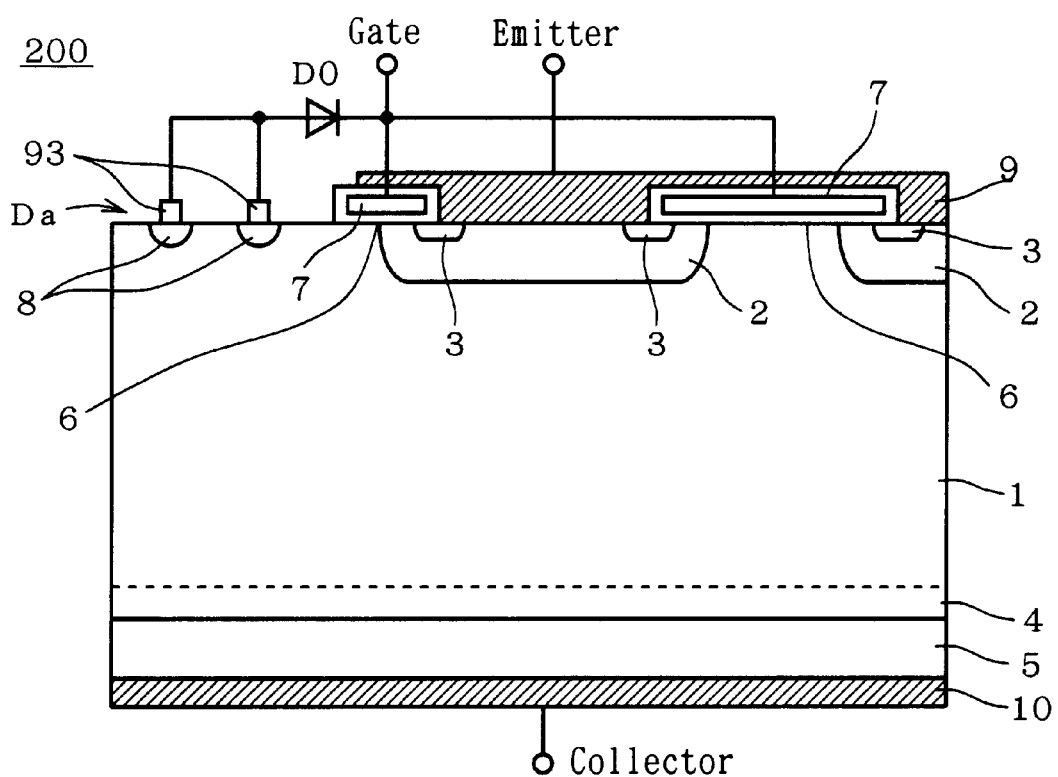
FIG. 8 is a cross-sectional view that schematically shows the configuration of a conventional technique.

FIG. 7 is a circuit diagram showing a fourth preferred embodiment of the present invention. This embodiment demonstrates a technique of driving a power transistor 100. As a power transistor 100, the semiconductor devices 101, 102 of the first or the third preferred embodiment can be employed. The gate and source of the NMOS transistor M1 are connected to a floating gate FG and the emitter terminal of the power transistor 100, respectively. The drain of the NMOS transistor M1 is connected to the base of NPN transistor Q2 through a resistor R1. The output terminal of a gate driver 20 is connected to the anode of a diode D1, and the cathode of the diode D1 is connected to the gate terminal of the power transistor 100 through a gate driving resistor Rg. The emitter of the NPN transistor Q2 is connected to the anode of a diode D2, and the cathode of the diode D2 is connected to the anode of the diode D1. A resistor R3 is connected between the emitter and base of the NPN transistor Q2. The base and collector of the NPN transistor Q2 are connected to the gate terminal of the power transistor 100, through the resistors R2 and R4, respectively.

The circuit shown in FIG. 7 is effective in avoiding the overvoltage breakdown caused by the spike voltage due to the parasitic inductance of wires when the turn-off operation occurs, rather than in protecting from the overvoltage due to the fluctuations of power supply voltage.

To drive a power transistor 100 to enter ON drive, the potential of the output terminal of a gate driver 20 is set to be higher than that of the emitter terminal of the power transistor 100 by about 15 V, so that a diode D1 receives the forward bias to enter the conductive state. At this time, a diode D2 receives the reverse bias and does not enter the conductive state, so that the transistor Q2 does not intervene the operation of the power transistor 100. Also, since the potential of a floating gate FG does not increase, the NMOS transistor M1 does not intervene the operation of the power transistor 100. As a result, the current is supplied to the gate terminal of the power transistor 100 through a gate driving resistor Rg (i.e, the input capacity of the power transistor 100 is charged), and the potential of the gate terminal increases so that the power transistor 100 is turned on.

To drive the power transistor 100 to enter OFF state, the potential of the output terminal of the gate driver 20 is set to a value lower than the potential of the emitter terminal of the power transistor 100. Therefore, the diode D1 receives the reverse bias, and the gate driving resistor Rg does not intervene the operation of the power transistor 100. On the other hand, the diode D2 receives the forward bias, and part of the charge that has been charged into the gate terminal of the power transistor 100 flows into the base of the NPN transistor Q2 through the resistor R2. This charge flow (i.e. current) is amplified by the NPN transistor Q2, and therefore, the charge from the gate terminal of the power transistor 100 flows into the output terminal of the gate driver 20 through a resistor R4, between the collector and emitter of the NPN transistor Q2, and the diode D2. This lowers the potential of the gate terminal of the power transistor 100, leading to its turn-off.

In the turn-off operation, the potential of the collector terminal of the power transistor 100 increases and the current that flows to the collector terminal decreases. However, in some cases, the induced voltage generates in the inductance being parasitic on wires, and a voltage higher than the power supply voltage is applied to the power transistor 100. In such a case, the potential of a floating gate FG is low if no overvoltage state occurs, and therefore, the NMOS transistor M1 is in OFF state and no drain current flows. As a result, the charge stored in the gate terminal of the power transistor 100 is discharged through the NPN transistor Q2 and the resistor R4, so that the transition to OFF state is completed. In this case, thanks to the amplification by the NPN transistor Q2, the current obtained from the gate terminal of the power transistor 100 can be set to be greater by the resistor R4. This permits a rapid transition to OFF state.

In the cases where an overvoltage state is caused in the course of turn-off operation, however, the potential of the floating gate FG of the power transistor 100 increases, and the NMOS transistor enters ON state. Then, the base current of the NPN transistor Q2 is bypassed through the resistor R1, and the NPN transistor enters OFF state. Accordingly, the current from the gate terminal of the power transistor 100 is limited by the resistors R1, R2. The resistors R1 and R2, which determine the operation bias point of the NPN transistor Q2, are normally set at a large value, and therefore, the current that flows to these resistors is suppressed.

In the phenomenon as stated above, the drop-down speed of the potential of the gate terminal of the power transistor 100 becomes slow, and the reduction rate of the current that flows to its collector terminal is lowered. Even if a parasitic inductance exists, the induced voltage becomes small. Therefore, the potential of the collector terminal of the power transistor 100 is lowered, preventing the overvoltage state from worsening. This means that the constant voltage clamp is performed by analog feedback.

In this embodiment, the power transistor 100 is driven in the state where its gate terminal potential is not lowered than its emitter terminal potential. Compared to the technique shown in the second preferred embodiment, the protection from overvoltage is attained without requiring the power supply for ON drive (i.e., the potential point Vcc connected to the emitter of the PNP transistor Q1). Accordingly, it is possible to obtain a semiconductor element as an apparently single IGBT 300, by integrating NPN transistor Q2, diodes D1, D2, resistors R1 to R4, and the NMOS transistor M1, together with a power transistor 100.

Other Modifications

Although the foregoing preferred embodiments relate to the N-channel type IGBTs, the present invention is applicable to the P-channel type IGBTs. A similar application is also possible to the semiconductor devices which can shut the current that flows to them by the control of their own insulated gates, e.g., MOSFETs, ESTs (Emitter Switched Thyristors). In addition, the elements shown in the second and fourth preferred embodiments, i.e., the insulated gate element for detecting overvoltage, and the transistor, diodes and resistors constituting the feedback circuit, can be combined by mounting and wiring them on a separate substrate, apart from the power transistor. It is, of course, possible to integrate these elements and the power transistor on a single chip by utilizing junction separation or dielectric separation method.

While the invention has been shown and described in detail, the foregoing description is in all aspects illustrative and not restrictive. It is therefore understood that numerous modifications and variations can be devised without departing from the scope of the invention.

I claim:

1. An insulated gate type semiconductor device comprising:

a semiconductor substrate;

first and second current electrodes sandwiching said semiconductor substrate;

a potential detection gate in a floating state for detecting a monitor potential that depends on a potential difference between said first and second current electrodes; and a drive gate insulated from said first and second current electrodes, for driving said first and second current electrodes to enter a conductive state when said monitor potential exceeds a specific level.

2. The insulated gate type semiconductor device of claim 1 wherein said drive gate and said potential detection gate are provided in first and second grooves, respectively, each extending in a thickness direction of said semiconductor substrate.

3. The insulated gate type semiconductor device of claim 2 wherein said semiconductor substrate has a first region of a first conductivity type, and a second region of a second conductivity type, closer to said second current electrode than said first region; and said first and second grooves reach said second region through said first region.

4. The insulated gate type semiconductor device of claim 3 further comprising an impurity region of said second conductivity type, apart from said second region in said first region around said first groove.

5. The insulated gate type semiconductor device of claim 4 wherein said second region has a higher impurity concentration in said second current electrode side than in said first current electrode side.

6. The insulated gate type semiconductor device of claim 1 wherein said drive gate and said potential detection gate are opposed, through insulating films, to a major surface of a side of said semiconductor substrate on which said first current electrode is provided.

7. The insulated gate type semiconductor device of claim 6 wherein said semiconductor substrate including:

a first region of a first conductivity type, containing said major surface;

a second region of a second conductivity type selectively formed in said first region exposing to said major surface; and a third region of said first conductivity type selectively formed in said second region exposing to said major surface, wherein said drive gate is opposed to said second region sandwiched between said first and third regions on said major surface.

8. The insulated gate type semiconductor device of claim 7 wherein said potential detection gate is opposed to said first region alone.

9. The insulated gate type semiconductor device of claim 1 further comprising:

an insulated gate type transistor having a control electrode to which said potential detection gate is connected, and first and second current electrodes insulated from said control electrode; and a drive circuit for performing charging/discharging to said drive gate, based on a current that flows to said second current electrode of said insulated gate type transistor, wherein said first current electrode of said insulated gate type transistor is connected to said first current electrode of said insulated gate type semiconductor device; and said insulated gate type transistor enters a conductive state when said monitor potential exceeds said specific level.

10. The insulated gate type semiconductor device of claim 9 wherein said drive circuit amplifies and output a current that flows to said second current electrode of said insulated gate type transistor, thereby charging said drive gate.

11. The insulated gate type semiconductor device of claim 10, said drive circuit comprising:

a first potential point for giving a first potential;

a bipolar transistor containing an emitter connected to said first potential point, a collector connected to said drive gate, and a base;

a first resistor connected between said second current electrode of said insulated gate type transistor and said base of said bipolar transistor;

a second resistor connected between said first potential point and said base of said bipolar transistor; and a second potential point for giving a second potential, connected to said collector of said bipolar transistor.

12. The insulated gate type semiconductor device of claim 11 wherein said drive circuit further includes a third resistor connected between said second potential point and said collector of said bipolar transistor.

13. The insulated gate type semiconductor device of claim 9, said drive circuit including:

a bipolar transistor having an emitter, a collector connected to said drive gate, and a base connected to said second current electrode of said insulated gate type transistor;

a first resistor connected between said emitter and base of said bipolar transistor; and a second resistor connected between said base of said bipolar transistor and said drive gate of said insulated gate type semiconductor device.

14. The insulated gate type semiconductor device of claim 13, said drive circuit further including a third resistor connected between said base of said bipolar transistor and said second current electrode of said insulated gate type transistor.

15. The insulated gate type semiconductor device of claim 14, said drive circuit further including a fourth resistor connected between said collector of said bipolar transistor and said drive gate.

16. The insulated gate type semiconductor device of claim 15, said drive circuit further including:

a fixed potential point; and a first diode having a first electrode connected to said emitter of said bipolar transistor, and a second electrode connected to said fixed potential point.

17. The insulated gate type semiconductor device of claim 16, said drive circuit further including a second diode having a first electrode having the same polarity as said first electrode of said first diode, and a second electrode connected to said drive gate.

18. The insulated gate type semiconductor device of claim 17, said drive circuit further including a fifth resistor interposed between said second electrode of said second diode and said drive gate.

19. The insulating gate type semiconductor device of claim 1, wherein said potential detection gate is located between the first and second current electrodes and is insulated from said semiconductor substrate.

20. The insulating gate type semiconductor device of claim 6, wherein said drive gate and said potential detection gate are located between the first and second current electrodes.

* * * * *